(12) United States Patent
Saito et al.

(10) Patent No.: US 8,008,818 B2
(45) Date of Patent: Aug. 30, 2011

(54) FLAT VIBRATION MOTOR

(75) Inventors: Koichiro Saito, Ueda (JP); Naoki Kanai, Ueda (JP); Mitsuru Ooi, Ueda (JP); Masaki Arai, Yamanasi-ken (JP)

(73) Assignees: Sanyo Electric Co., Ltd., Moriguchi-shi (JP); Sanyo Seimitsu Co., Ltd., Ueda-shi (JP)

( * ) Notice: Subject to any disclaimer, the term of this patent is extended or adjusted under 35 U.S.C. 154(b) by 0 days.

(21) Appl. No.: 12/725,666

(22) Filed: Mar. 17, 2010

(65) Prior Publication Data

US 2010/0237728 A1    Sep. 23, 2010

(30) Foreign Application Priority Data

Mar. 23, 2009   (JP) .................................. 2009-069750
Jul. 21, 2009   (JP) .................................. 2009-170038

(51) Int. Cl.
*H02K 7/065* (2006.01)
*H02K 7/075* (2006.01)
(52) U.S. Cl. ..................... 310/81; 310/71; 310/DIG. 6
(58) Field of Classification Search .............. 310/81, 310/71, 51, DIG. 6, 67 R, 156.32–156.37; *H02K 7/075, 7/065*
See application file for complete search history.

(56) References Cited

U.S. PATENT DOCUMENTS

| | | | | |
|---|---|---|---|---|
| 6,080,352 A * | 6/2000 | Dunfield et al. | ............. | 264/427 |
| 6,628,028 B2 * | 9/2003 | Yoshida et al. | ............. | 310/91 |
| 6,841,905 B2 * | 1/2005 | Yamaguchi | ............. | 310/81 |
| 6,998,743 B2 * | 2/2006 | Fujii et al. | ............. | 310/81 |
| 7,132,770 B2 * | 11/2006 | Yamaguchi et al. | ............. | 310/81 |
| 7,224,090 B2 * | 5/2007 | Oh et al. | ............. | 310/14 |
| 7,294,393 B2 * | 11/2007 | Murai et al. | ............. | 428/306.6 |
| 7,598,638 B2 * | 10/2009 | Yamaguchi | ............. | 310/81 |
| 7,781,927 B2 * | 8/2010 | Park et al. | ............. | 310/81 |
| 7,800,274 B2 * | 9/2010 | Yamaguchi et al. | ............. | 310/254.1 |
| 2005/0127761 A1 * | 6/2005 | Yashima | ............. | 310/51 |
| 2007/0128893 A1 * | 6/2007 | Wu et al. | ............. | 439/74 |
| 2010/0264766 A1 * | 10/2010 | Kim et al. | ............. | 310/81 |

FOREIGN PATENT DOCUMENTS

JP   2005-27484 A1   1/2005

* cited by examiner

*Primary Examiner* — Burton Mullins
*Assistant Examiner* — Thomas Truong
(74) *Attorney, Agent, or Firm* — Kratz, Quintos & Hanson, LLP

(57) ABSTRACT

A flat vibration motor able to be mounted to a device side board by just reflow processing and able to reduce the occupied area, that is, a flat vibration motor provided with a stator plate having a through hole into which one end of a shaft is fit, the stator plate having a magnetic metal core plate having detent torque generating holes $10a$ to $10c$, interconnect patterns arranged on a first electrical insulating film formed on this front surface, and electrode patterns arranged on a second electrical insulating film formed on a back surface of the magnetic metal core plate and connected with the interconnect patterns through the through holes $h_1$ to $h_3$, the insides of the detent torque generating holes $10a$ to $10c$ being covered by front-to-back superposed films formed by extensions of the first electrical insulating film and second electrical insulating film.

8 Claims, 8 Drawing Sheets

US 8,008,818 B2

FLAT VIBRATION MOTOR

CROSS-REFERENCE TO RELATED APPLICATION

This application is based upon and claims the benefit of priority of the prior Japanese Patent Application No. 2009-69750, filed on Mar. 23, 2009, and prior Japanese Patent Application No. 2009-170038, filed on Jul. 21, 2009, the entire contents of which are incorporated herein by reference.

BACKGROUND OF THE INVENTION

1. Field of the Invention

The present invention relates to a flat vibration motor built into a mobile phone etc., more particularly relates to a structure of a stator plate for the same.

2. Description of the Related Art

In the past, as a flat vibration motor, for example a brushless motor has been provided with a stainless steel disk shaped stator plate on which one end of a shaft is press fit into a burring part, a stainless steel U-sectional cover with an open part covered by the stator plate and to which the other end of the shaft is fit in a shaft mounting hole, a rotor plate having an axial direction field type rotor magnet and eccentric weight supported to be able to rotate via a slide bearing through which the shaft runs, and a flexible printed circuit board superposed on the stator plate and mounting a plurality of stator coils, current control IC's, and other electronic devices. The stator plate has a plurality of detent torque generating holes for avoiding cessation of rotation at the dead points of the rotor plate around the burring part.

Here, the stator plate, for convenience in feeding power to the required interconnect of the flexible printed circuit board, has an ear-shaped power feed terminal mount sticking out from the arc-shaped outer periphery outward in the radial direction. This is electrically connected to a power feed pattern on the device side board mounting this flat vibration motor through this flexible printed circuit board on this power feed terminal mount. Further, the stator plate is provided at a plurality of locations with detent torque generating holes. Due to this, there is the problem of entry of solder into these holes, so the plate has mounting legs sticking out from the arc-shaped outer periphery outward in the radial direction and can be fastened to the device side board mounting the flat vibration motor by reflow solder.

As related art, there is Japanese Patent Publication (A) No. 2005-27484 (FIG. 2).

In the above flat vibration motor, the stator plate has a power feed terminal mount and a plurality of mounting legs sticking out from the arc-shaped outer periphery outward in the radial direction, so these end up sticking out from the occupied area of the cover having the arc-shaped opening and additionally uses up space of the device side board mounting the flat vibration motor.

Further, the electrical connection to the device side board by the flexible printed circuit board and the mechanical fastening by the mounting legs are separate matters. The mounting work therefore becomes troublesome.

SUMMARY OF THE INVENTION

In view of the above problems, an object of the present invention is to provide a flat vibration motor which can be mounted on a device side board by just reflow processing and enables the occupied area to be reduced.

The present invention provides a flat vibration motor provided with a stator plate having a through hole in which one end of a shaft is fit, a cover with an open part covered by the stator plate and having a shaft mounting hole in which the other end of the shaft is fit, and a rotor plate having an axial direction field type rotor magnet and eccentric weight supported to be able to rotate through a slide bearing through which the shaft passes, wherein the stator plate has a magnetic metal core plate having a plurality of detent torque generating spaces around the through hole, printed interconnect patterns arranged on a first electrical insulating film formed on a front surface of this magnetic metal core plate and interconnecting mounted electronic devices with each other, and electrode patterns arranged on a second electrical insulating film formed on a back surface of the magnetic metal core plate and connecting with interconnect patterns through through holes, the insides of the detent torque generating spaces being covered by front-to-back superposed films of extensions of the first electrical insulating film and second electrical insulating film.

A conventional flexible printed circuit board can be replaced by the first electrical insulating film and interconnect patterns on the surface of the magnetic metal core plate. Further, the electrode patterns on the second electrical insulating film can be surface mounted on the device side board by reflow processing. In addition, the occupied area can be reduced. Further, the detent torque generating spaces are covered by the front-to-back superposed films of the first electrical insulating film and second electrical insulating film, so it is possible to cut off the inside of the motor from the outside world. Furthermore, it is possible to reduce the number of parts and possible to simplify the assembly process.

The detent torque generating spaces are preferably holes and the magnetic metal core plate is preferably provided with notches connecting the outer periphery to the holes. When using such a magnetic metal core plate to produce a stator plate, the front and back of the magnetic metal core plate are coated with a first electrical insulating film and a second electrical insulating film, then the surface is flattened in a stamping process stamping the two electrical insulating films. During this time, even if voids enter between the two electrical insulating films at the broad detent torque generating holes, the stamping process enables the voids to be pushed to the outside through the radial direction notches. For this reason, it is possible to suppress residual voids in front-to-back superposed films, possible to form dense, integral front-to-back superposed films, and possible to suppress the occurrence of cracks.

Further, the vicinity of the peripheral edge of the through hole at the stator plate is preferably an exposed part of the magnetic metal core plate in the range where no second electrical insulating film is formed. One end of the shaft can be fit in the through hole, then the exposed part can be used to weld the shaft to the magnetic metal core plate.

Here, the detent torque generating spaces become relatively large, so with just coverage by the front-to-back superposed films of the first electrical insulating film and the second electrical insulating film, when impact etc. occurs, the front-to-back superposed films easily crack etc. Therefore, when the electrode patterns run across the second electrical insulating film of the front-to-back superposed films, the running electrode patterns serve as reinforcing frames of the front-to-back superposed films, so it is possible to suppress cracking and possible to secure the fastening area required by the electrode patterns and achieve fastening strength.

When the interconnect patterns include first and second interconnect patterns and the electrode patterns include an inside circular ring shaped electrode pattern connected with the first interconnect pattern through a first through hole and formed concentrically with the through hole and an outside circular ring shaped electrode pattern connected with the second interconnect pattern through a second through hole and formed concentrically with the inside circular ring shaped electrode pattern, the power feed patterns of the device side board mounting this flat vibration motor also have to be formed as an inside circular ring shaped pattern and an outside circular ring shaped pattern concentric with the same. When mounting the flat vibration motor on a board before reflow processing, the double circular ring shaped patterns are superposed, so deviation in orientation about the center due to just center positioning does not become an issue.

Furthermore, the interconnect patterns include a third interconnect pattern, while the electrode patterns include a center circular ring shaped electrode pattern connected with the third interconnect pattern through a third through hole and formed concentrically about the through hole. This center circular ring shaped electrode pattern becomes a third electrode for the electronic device mounted on the first electrical insulating film, so can also be utilized as a control electrode or ground electrode for giving a braking action at the time of cessation of rotation of the flat vibration motor.

The inside circular ring shaped electrode pattern and the outside circular ring shaped electrode pattern may be given widths of the circular ring shapes for forming through holes in those widths, but it is hard to give the circular ring shape of the center circular ring shaped electrode pattern a width enabling formation of the third through hole in that width. Therefore, the third through hole is provided at a position in the interval between the center circular ring shaped electrode pattern and the inside circular ring shaped electrode pattern.

Further, the circular ring shape of the inside circular ring shaped electrode pattern preferably has a width greater than the width of the circular ring shape of the outside circular ring shaped electrode pattern. The area of the inside circular ring shaped electrode pattern can be made equal to the area of the outside circular ring shaped electrode pattern and the distribution of fastening strength can be equalized.

The detent torque generating spaces may be round or fan shaped holes. The fan shapes may be acute angle fan shapes or obtuse angle fan shapes. Further, notch shapes are also possible.

Summarizing the advantageous effects of the invention according to the present invention, the motor can be mounted on a device side board by reflow processing and the occupied space can be reduced.

BRIEF DESCRIPTION OF THE DRAWINGS

These and other objects and features of the present invention will become clearer from the following description of the preferred embodiments given with reference to the attached drawings, wherein:

FIG. 1A is a perspective view of the appearance of a flat vibration motor according to an embodiment of the present invention, while

FIG. 2A is a perspective view showing the state of the same flat vibration motor when seen from the bottom side, while

FIG. 3A is a plan view showing a stator plate of an Embodiment 1 used for the same flat vibration motor, while

FIG. 4A is a cross-sectional view showing the state cut along the line a-a' in FIG. 3A, while

FIG. 5A is a plan view showing a stator plate of an Embodiment 2 used for the same flat vibration motor, while

FIG. 6A is a plan view showing a stator plate of an Embodiment 3 used for the same flat vibration motor, while

FIG. 8A is a plan view showing the stator plate of the Embodiment 4, while

DESCRIPTION OF PREFERRED EMBODIMENTS

Preferred embodiments of the present invention will be described in detail below while referring to the attached figures.

Embodiment 1

Figure 1A:
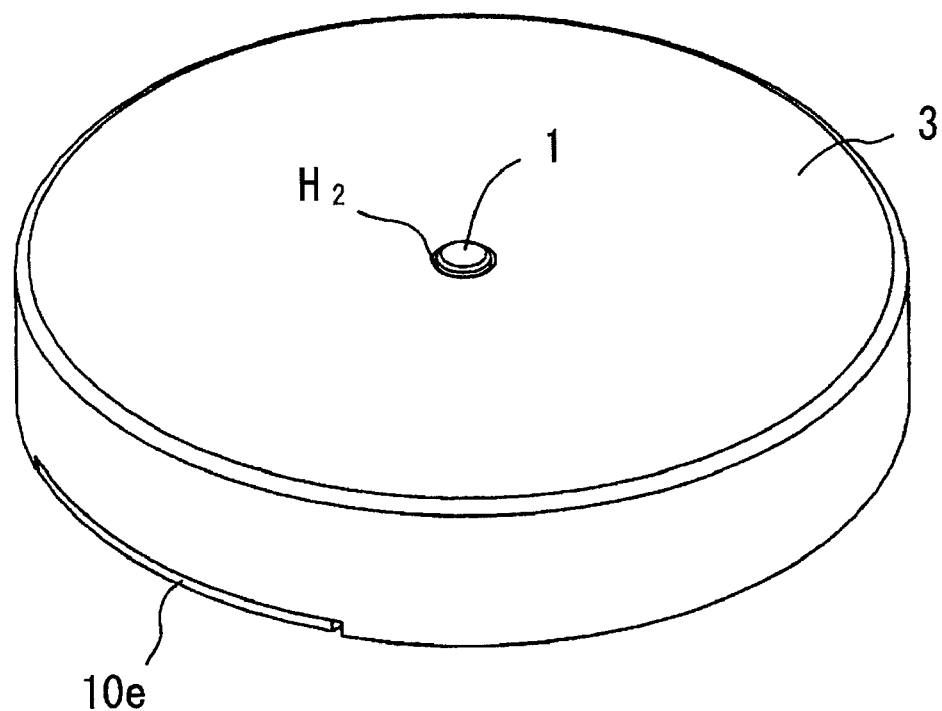
Figure 1B:
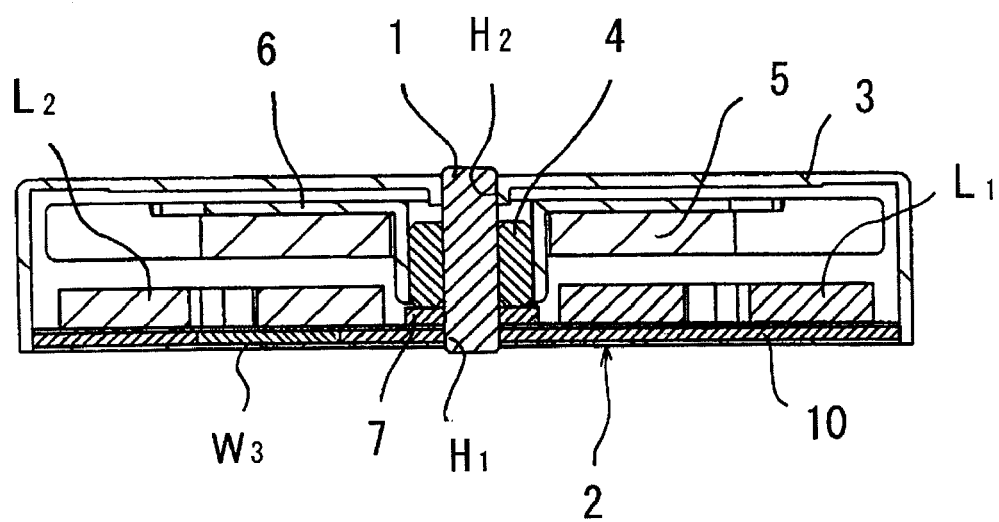
FIG. 1B is a longitudinal cross-sectional view showing the same flat vibration motor.
Figure 2A:
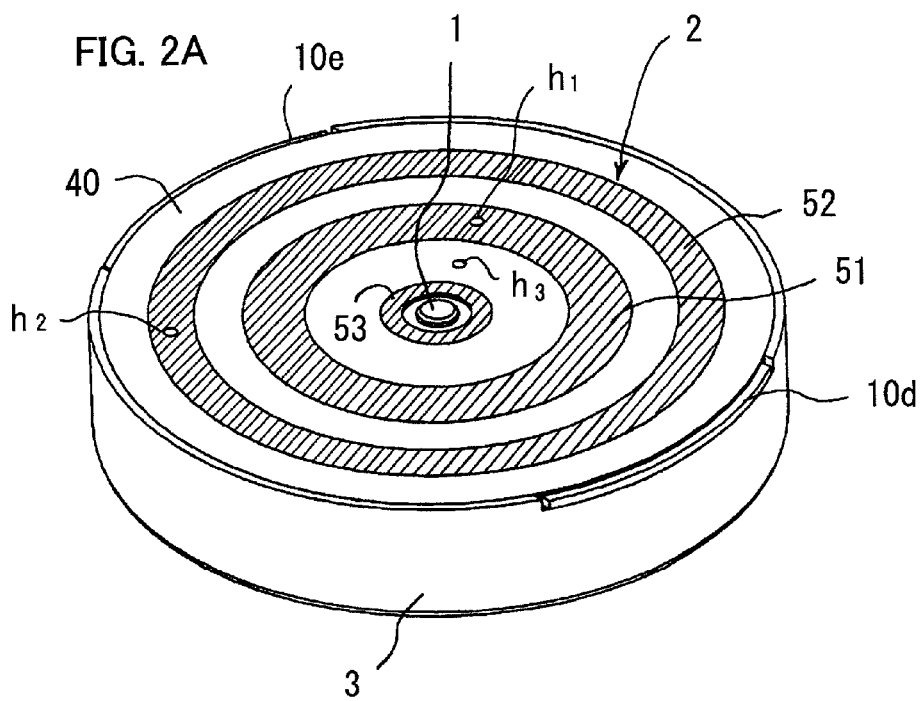
Figure 2B:
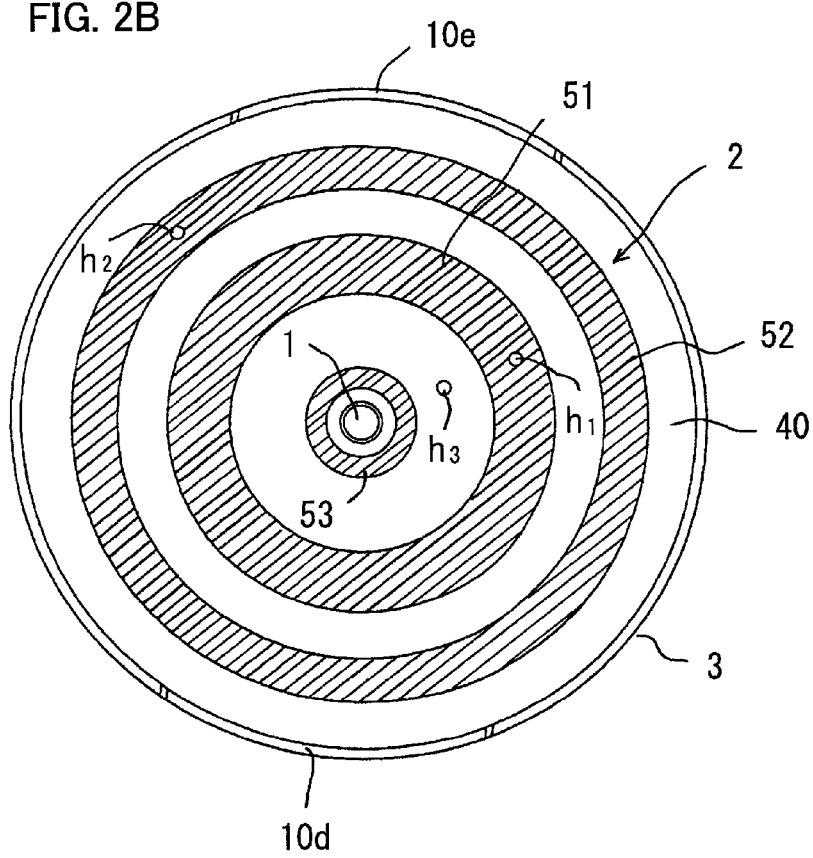
FIG. 2B is a bottom view of the same flat vibration motor.

The flat vibration motor of this example is a brushless motor. As shown in FIG. 1 and FIG. 2, this is provided with a disk shaped stator plate 2 having a through hole $H_1$ in which one end of a shaft (fixed shaft) 1 is fit, a stainless steel U-sectional cover 3 having an open part covered by the stator plate 2 and having a shaft mounting hole $H_2$ of a burring part into which the other end of the shaft 1 is fit, and a rotor frame 6 having an axial direction field type rotor magnet 5 and eccentric weight (not shown) supported to be able to rotate via a slide bearing 4 through which the shaft 1 passes. Note that, 7 is a washer for receiving an end face of the rotating slide bearing 4.

Figure 3A:
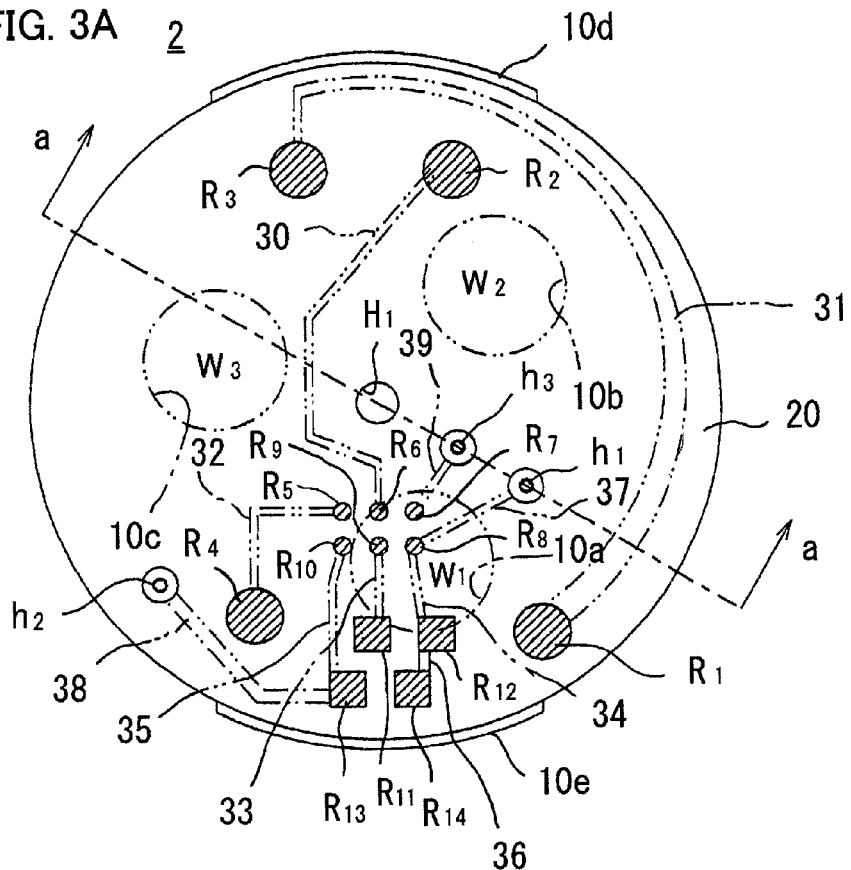
Figure 3B:
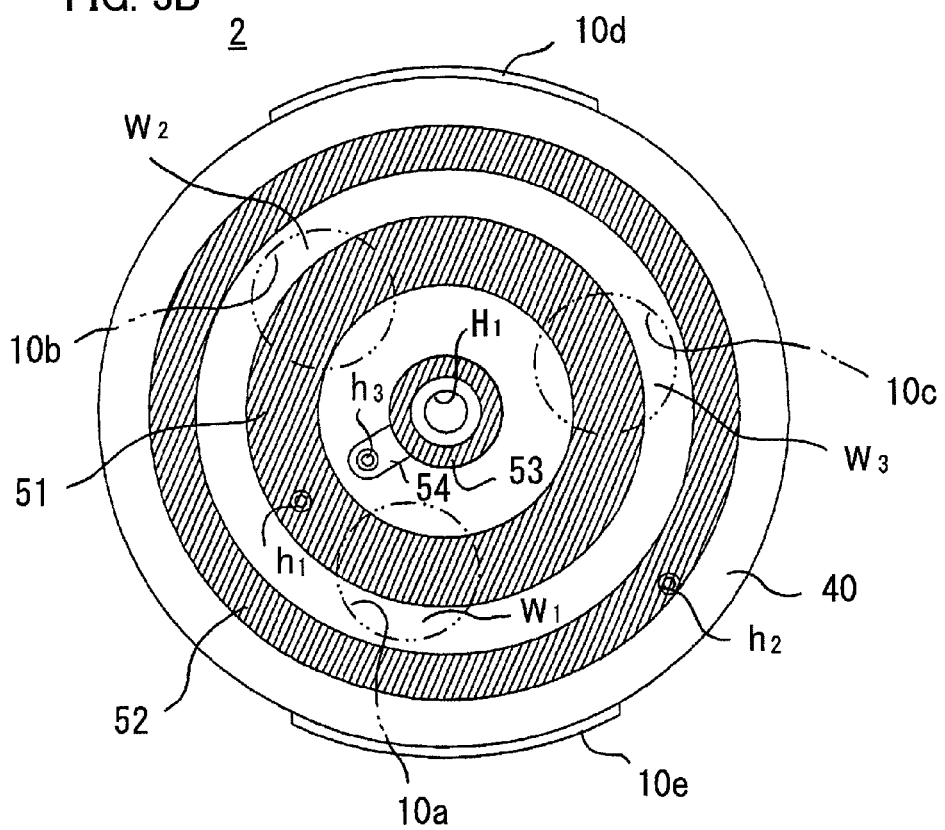
FIG. 3B is a bottom view of the same stator plate.
Figure 4A:
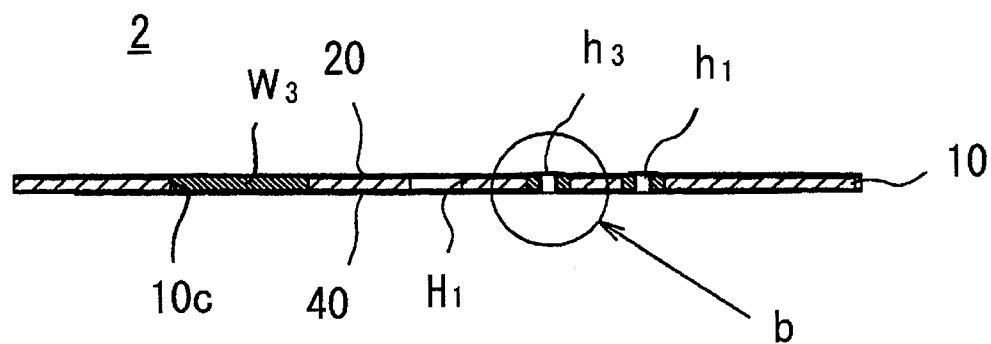
Figure 4B:
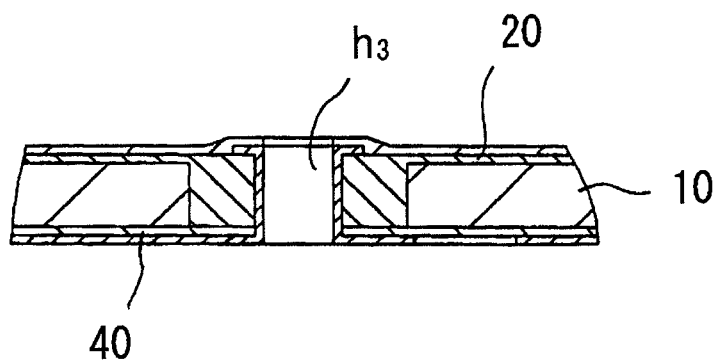
FIG. 4B is a partial enlarged view showing the part b in FIG. 4A enlarged.

The stator plate 2, as shown in FIG. 2 to FIG. 4, has a substantially disk shaped magnetic metal core plate 10 having a center through hole $H_1$ around which are formed, at 120° intervals, three circular detent torque generating holes 10a to 10c and protruding arc shapes 10d, 10e, interconnect patterns 30 to 39 arranged on a first electrical insulating film 20 formed on a front surface of the magnetic metal core plate 10 (inside surface) and connecting mounted electronic devices with each other, and electrode patterns 51 to 53 arranged on a second electrical insulating film 40 formed on a back surface of the magnetic metal core plate 10 (outer surface). The first electrical insulating film 20 and the second electrical insulating film 40 extend to the insides of the detent torque generating holes 10a to 19c to form integral front-to-back superposed films $W_1$ to $W_3$. The detent torque generating holes 10a to 10c are covered by the front-to-back superposed films $W_1$ to $W_3$.

On the first electrical insulating film 20, as shown in FIG. 3A, lands $R_1$ and $R_2$ for soldering terminals of a no-core coil $L_1$, lands $R_3$ and $R_4$ for soldering terminals of another no-core coil $L_2$, lands $R_5$ to $R_{10}$ for connecting terminals of current control ICs (not shown), lands $R_{11}$ and $R_{12}$ for connecting terminals of a first capacitor (not shown), and lands $R_{13}$ and $R_{14}$ for connecting terminals of a second capacitor (not shown) are formed in exposed states (illustrated hatchings). The land $R_2$ is connected from the land $R_6$ through the interconnect pattern 30, the land $R_3$ is connected from the land $R_1$ through the interconnect pattern 31, the land $R_4$ is connected from the land $R_5$ through the interconnect pattern 32, and the no-core coils $L_1$ and $L_2$ are connected in series. Further, the land $R_{11}$ is connected from the land $R_9$ through the interconnect pattern 33, the land $R_{12}$ is connected from the land $R_8$ through the interconnect pattern 34, the land $R_{13}$ is connected from the land $R_{10}$ through the interconnect pattern 35, and the land $R_{14}$ is connected from the land $R_{12}$ through the interconnect pattern 36. Furthermore, on this first electrical insulating film 20, a first power feed interconnect pattern 37 connecting the first through hole $h_1$ and land $R_8$, a second power feed interconnect pattern 38 connecting the second through hole $h_2$ and land $R_{13}$, and a third power feed interconnect pattern 39 connecting the third through hole $h_3$ and land $R_7$ are formed. Note that, the portions of the protruding arc shapes 10d and 10e function as receiving plates of the cover 3, but are not covered by the first electrical insulating film 20 and second electrical insulating film 40. The exposed parts of the protruding arc shapes 10d and 10e are used to enable the cover 3 to be welded to the exposed parts.

On the other hand, on the second electrical insulating film 40, an inside circular ring shaped electrode pattern 51 connected with the first power feed interconnect pattern 37 through the first through hole $h_1$ and formed concentrically with the through hole $H_1$, an outside circular ring shaped electrode pattern 52 connected with the second power feed interconnect pattern 38 through the second through hole $h_2$ and formed concentrically with the inside circular ring shaped electrode pattern 51, and a center circular ring shaped electrode pattern 53 connected with the third power feed interconnect pattern 39 through the third through hole $h_3$ and formed concentrically around the through hole $H_1$ are formed. The inside circular ring shaped electrode pattern 51 runs across the second electrical insulating film 40 at the front-to-back superposed films $W_1$ to $W_3$ covering the detent torque generating holes 10a to 10c.

The circular ring shape of the center circular ring shaped electrode pattern 53 is narrow in width, so it is difficult to give a width for forming the third through hole $h_3$ in that width. Therefore, the third through hole $h_3$ is positioned in the interval between the center circular ring shaped electrode pattern 53 and the inside circular ring shaped electrode pattern 51 and connected by a lead-out interconnect 54 to the center circular ring shaped electrode pattern 53. Further, the circular ring shape of the inside circular ring shaped electrode pattern 51 is formed wider than the width of the circular ring shape of the outside circular ring shaped electrode pattern 52.

The stator plate 2 in this example has interconnect patterns 30 to 39 arranged on the first electrical insulating film 20 formed on the front surface of the magnetic metal core plate 10 and electrode patterns 51 to 53 arranged on the second electrical insulating film 40 formed on the back surface of the magnetic metal core plate 10 and connected to the interconnect patterns 37 to 39 through the through holes $h_1$ to $h_3$. The insides of the detent torque generating holes 10a to 10c are covered by the front-to-back superposed films $W_1$ to $W_3$ of the extensions of the first electrical insulating film 20 and second electrical insulating film 40. For this reason, the conventional flexible printed circuit board can be replaced by the first electrical insulating film 20 and interconnect patterns 30 to 39 on the front surface of the magnetic metal core plate 10. Further, the electrode patterns 51 to 53 on the second electrical insulating film 40 enable surface mounting to the device side board by reflow processing and further enable the area occupied to be reduced. Further, the insides of the detent torque generating holes 10a to 10c are covered by the front-to-back superposed films $W_1$ to $W_3$ of the first electrical insulating film 20 and second electrical insulating film 40, so the inside of the motor can be cut off from the outside world. Furthermore, the number of parts can be slashed and the assembly process can be simplified.

Here, the detent torque generating holes 10a to 10c are holes larger than the through holes $h_1$ to $h_3$ etc., so if just covered by the front-to-back superposed films $W_1$ to $W_3$ of the first electrical insulating film 20 and the second electrical insulating film 40, at the time of impact etc., the front-to-back superposed films $W_1$ to $W_3$ will easily crack.

Therefore, the inside circular ring shaped electrode pattern 51 is run over the second electrical insulating film 40 of the front-to-back superposed films $W_1$ to $W_3$ of this example, so the run inside circular ring shaped electrode pattern 51 becomes a frame for the front-to-back superposed films $W_1$ to $W_3$ and enables cracks to be suppressed. Further, the fastening area required by the inside circular ring shaped electrode pattern 51 can be secured and the fastened strength can be achieved.

The power feed patterns of the device side board (not shown) mounting the flat vibration motor also have to be formed as an inside circular ring shaped pattern and concentric outside circular ring shaped pattern, but when mounting the flat vibration motor on the board before reflow processing, the double circular ring shaped patterns are superposed, so deviation in orientation about the center due to just center positioning does not become an issue.

In this example, the center circular ring shaped electrode pattern 53 connected with the third power feed interconnect pattern 39 through the third through hole $h_3$ is utilized as a control electrode or ground electrode for giving a braking action at the time of cessation of rotation of the flat vibration motor.

The inside circular ring shaped electrode pattern 51 and the outside circular ring shaped electrode pattern 52 may be given widths of the circular ring shapes for forming the through holes $h_1$ and $h_2$ in those widths, but it is hard to give the circular ring shape of the center circular ring shaped electrode pattern 53 a width enabling formation of the third through hole $h_3$ in the width. Therefore, the third through hole $h_3$ is provided at a position in the interval between the center circular ring shaped electrode pattern 53 and the inside circular ring shaped electrode pattern 51, and the lead-out interconnect 54 is used to connect to the center circular ring shaped electrode pattern 53. Further, the circular ring shape of the inside circular ring shaped electrode pattern 51 can be formed with a width broader than the width of the circular ring shape of the outside circular ring shaped electrode pattern 52. The area of the inside circular ring shaped electrode pattern 51 can be made equal to the area of the outside circular ring shaped electrode pattern 52 and the distribution of fastening strength can be equalized.

Note that, the first electrical insulating film 20 in the front-to-back superposed film $W_1$ in the detent torque generating hole 10a is also covered with the lands $R_6$ to $R_9$ and the interconnect patterns 33, 34, and 37, so a reinforcing effect is exhibited.

Embodiment 2

Figure 5A:
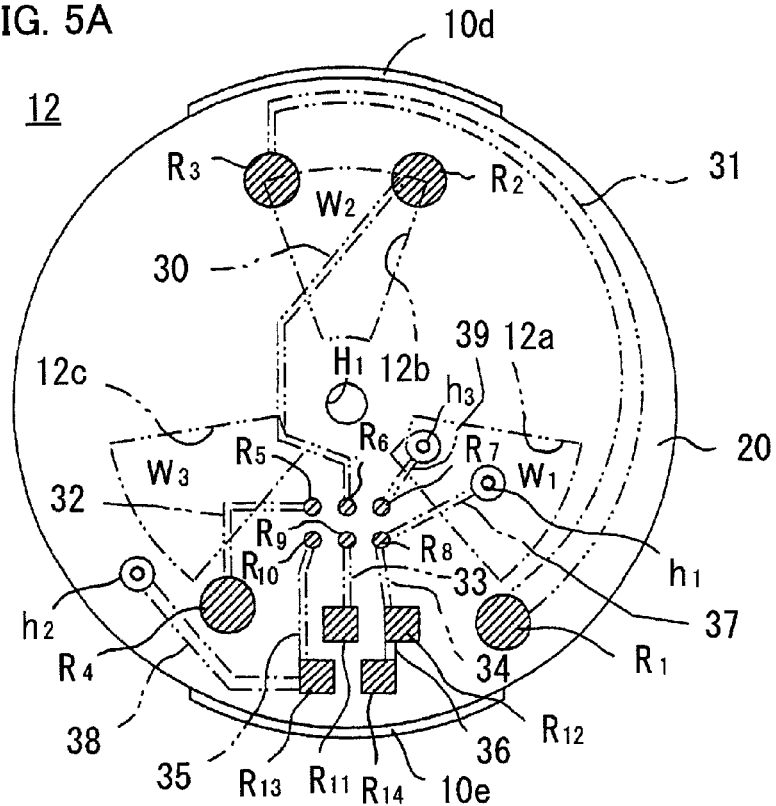
Figure 5B:
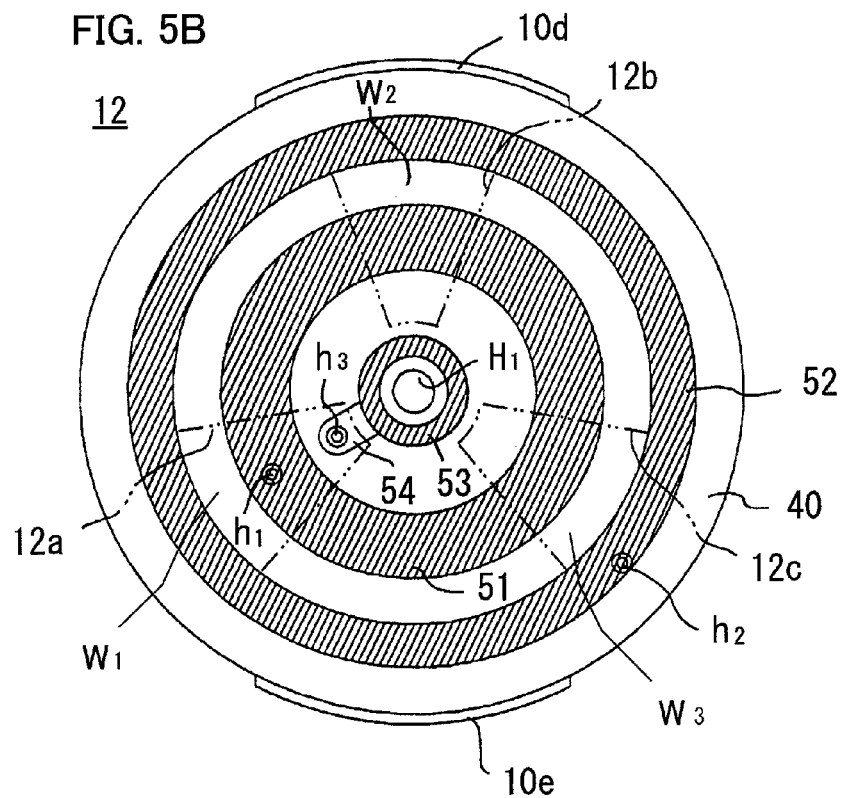
FIG. 5B is a bottom view of a stator plate of the Embodiment 2.

FIG. 5A is a plan view showing a stator plate of an Embodiment 2; and FIG. 5B is a bottom view of a stator plate of the Embodiment 2. In FIG. 5, parts the same as parts shown in FIG. 3 are assigned the same reference numerals and explanations thereof are omitted.

The detent torque generating holes 10a to 10c of the stator plate 2 of the Embodiment 1 were round, while the detent torque generating holes 12a to 12c of the stator plate 12 of this example are acute angle fan shapes. Further, in the front-toback superposed films $W_1$ to $W_3$, positions of the lands $R_5$ to $R_{10}$ for mounting current control ICs are not included. The stress at the time of mounting devices is not received by the front-to-back superposed films $W_1$ to $W_3$. Instead, the front-to-back superposed film $W_1$ is formed with the through holes $h_1$ and $h_3$ and interconnect patterns 37 and 39, the front-to-back superposed film $W_2$ is formed with the interconnect pattern 30, and the front-to-back superposed film $W_3$ is formed with the interconnect pattern 32. Of course, the inside circular ring shaped electrode pattern 51 runs along the back surface of the front-to-back superposed films $W_1$ to $W_3$ as shown in FIG. 5B, so the front-to-back superposed films $W_1$ to $W_3$ are reinforced at both sides.

Embodiment 3

Figure 6A:
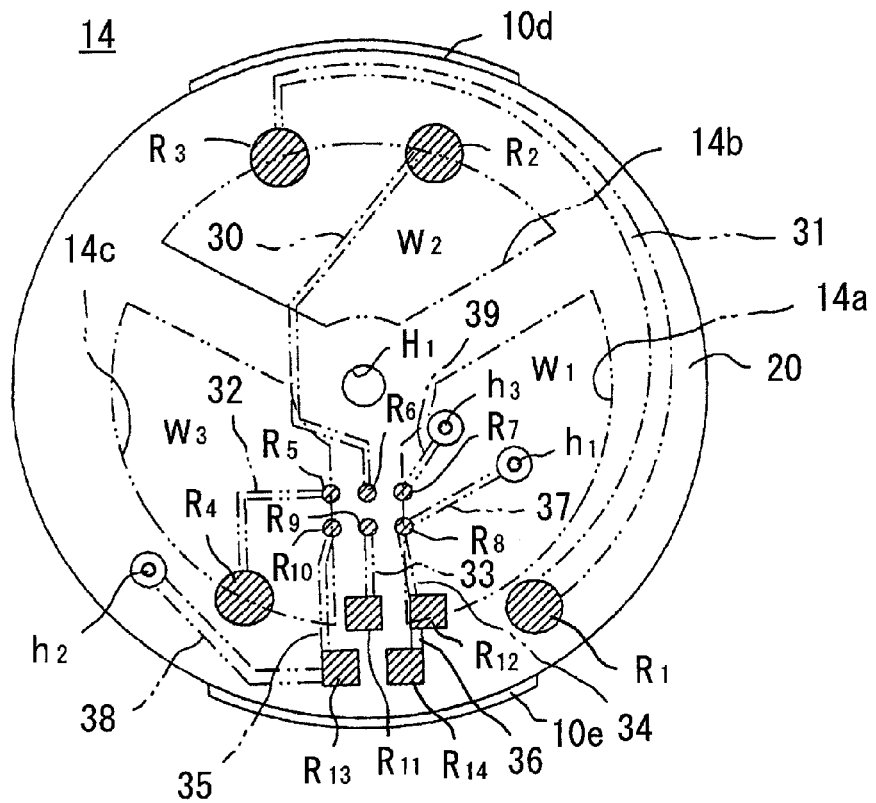
Figure 6B:
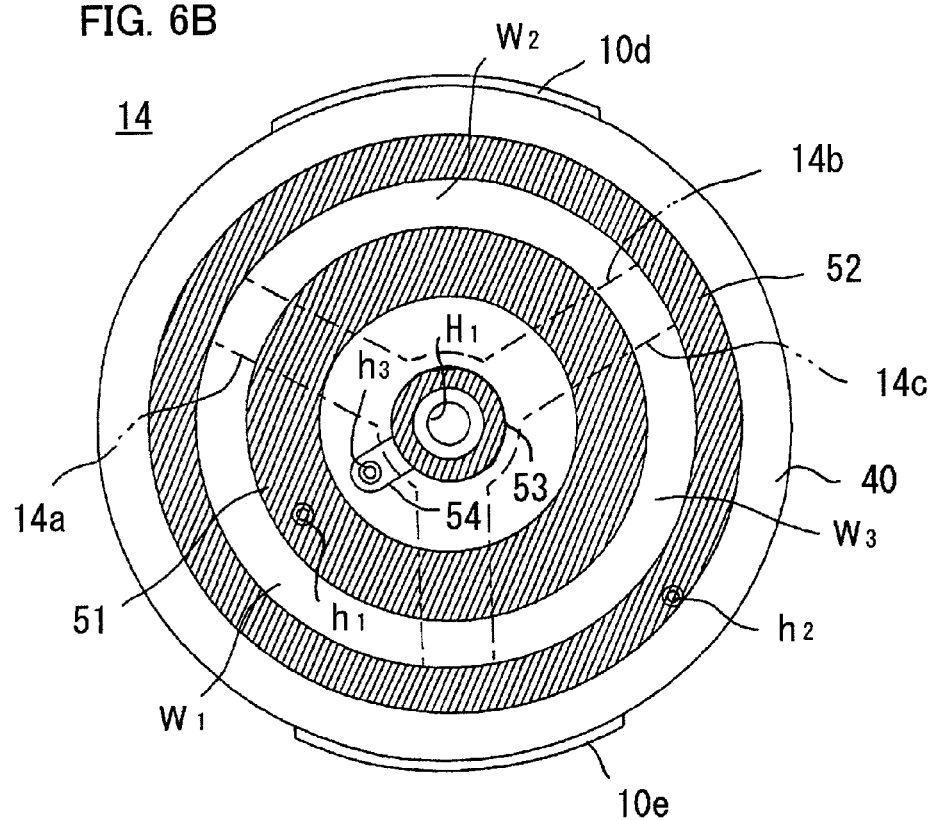
FIG. 6B is a bottom view of a stator plate of the Embodiment 3.

FIG. 6A is a plan view showing a stator plate of an Embodiment 3; and FIG. 6B is a bottom view of a stator plate of the Embodiment 3. In FIG. 6, parts the same as parts shown in FIG. 3 are assigned the same reference numerals and explanations thereof are omitted.

The detent torque generating holes 14a to 14c of the stator plate 14 of this example are obtuse angle fan shapes and are considerably broader in areas than the detent torque generating holes 12a to 12c of FIG. 5. However, the lands $R_7$, $R_8$, and $R_{12}$ are formed straddling the edges of the detent torque generating hole 14a, the lands $R_2$ and $R_3$ are formed straddling the edges of the detent torque generating hole 14b, and the lands $R_4$, $R_5$, and $R_{10}$ are formed straddling the edges of the detent torque generating hole 14c, so at the time of mounting devices, the front-to-back superposed films $W_1$ to $W_3$ are not given much stress.

Embodiment 4

Figure 7:
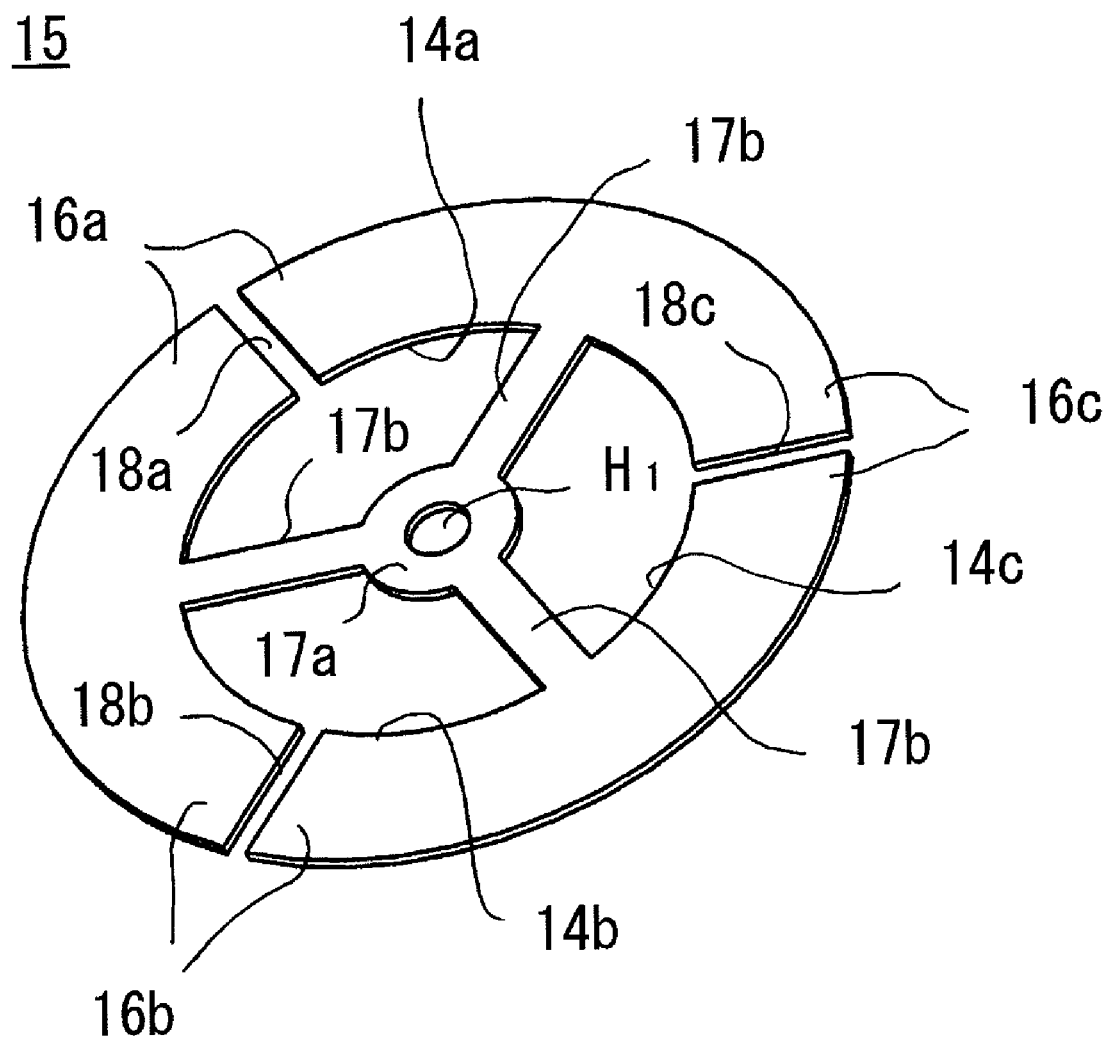
FIG. 7 is a perspective view of a magnetic metal core plate used for the stator plate of the Embodiment 4 used for the same flat vibration motor.
Figure 8A:
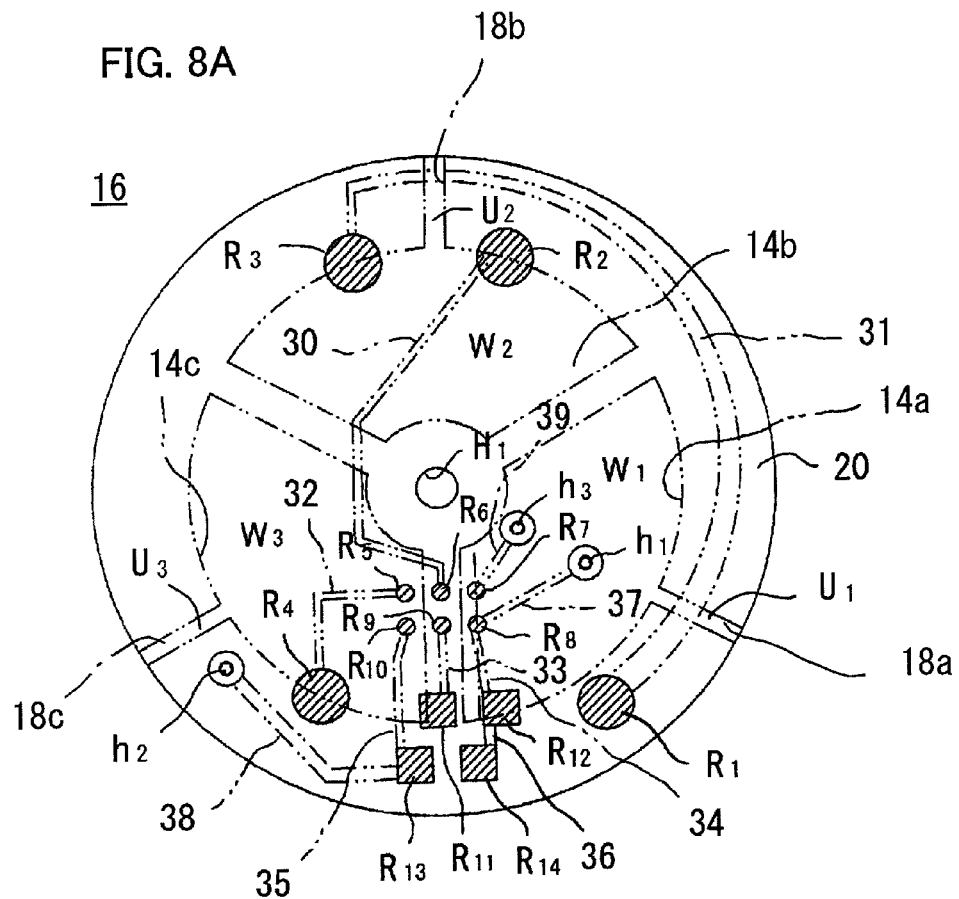
Figure 8B:
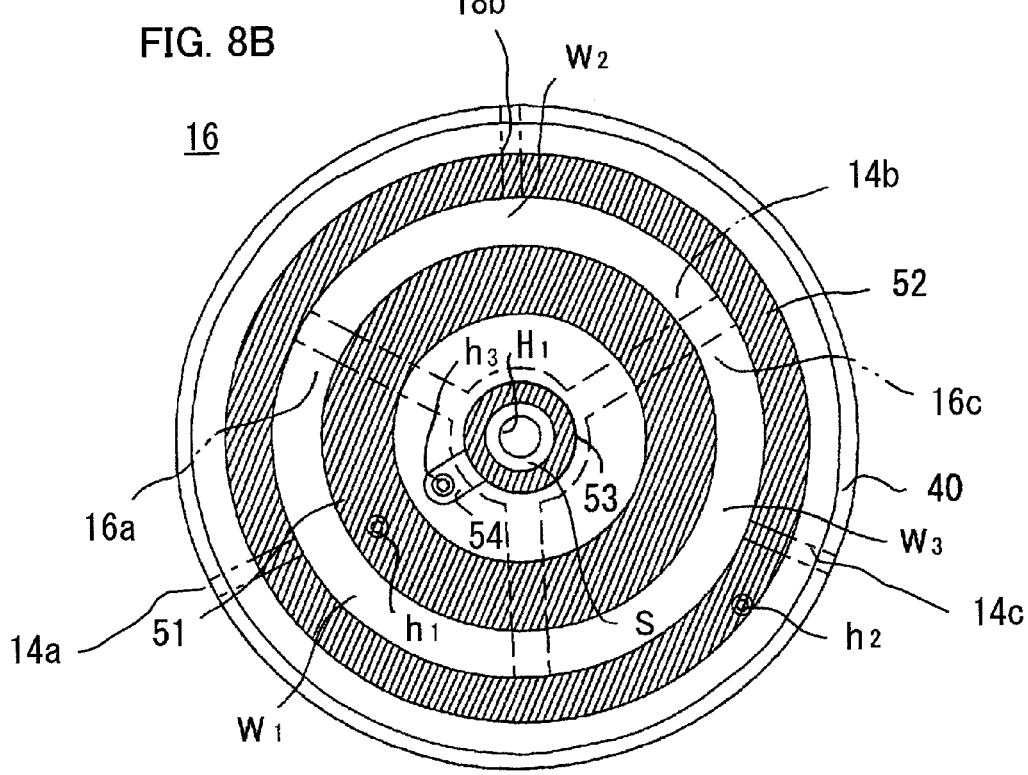
FIG. 8B is a bottom view of the stator plate of the Embodiment 4.

FIG. 7 is a perspective view of a magnetic metal core plate used for the stator plate of an Embodiment 4; FIG. 8A is a plan view showing the stator plate of the Embodiment 4; and FIG. 8B is a bottom view of the stator plate of the Embodiment 4. In FIG. 8, parts the same as parts shown in FIG. 6 are assigned the same reference numerals and explanations thereof are omitted.

The magnetic metal core plate 15 used for the stator plate 16 of this example, as shown in FIG. 7, has detent torque generating holes 14a to 14c of obtuse angle fan shapes similar to the Embodiment 3. The detent torque generating holes 14a to 14c are surrounded by a center ring circular ring shaped part 17a having a through hole $H_1$, struts 17b extending from this center ring circular ring shaped part 17a in three radial directions, and arc-shaped outside plate parts 16a to 16c. Radial direction notches 18a to 18c are provided splitting the arc-shaped outside plate parts 16a to 16c at their middle parts and connecting to the detent torque generating holes 14a to 14c.

Further, the insides of the radial direction notches 18a to 18c are also, as shown in FIG. 8, covered by the front-to-back superposed films $U_1$ to $U_3$ of the first electrical insulating film 20 and the second electrical insulating film 40. The outside circular ring shaped electrode pattern 52 runs across the back surfaces of the front-to-back superposed films $U_1$ to $U_3$, while the interconnect pattern 31 runs across the front surfaces of the front-to-back superposed film $U_1$ and $U_2$.

Note that the range surrounded by the through hole $H_1$ of the stator plate 16 and the center circular ring shaped electrode pattern 53 of this example forms a region where the second electrical insulating film 40 is not formed and forms an exposed part S of the center ring circular ring shaped part 17a of the magnetic metal core plate 15. One end of the shaft 1 is fit into the through hole $H_1$, then the exposed part S is used to weld the shaft 1 to the magnetic metal core plate 15.

When using a magnetic metal core plate 15 provided with radial direction notches 18a to 18c connecting to the detent torque generating holes 14a to 14c in this way to produce a stator plate 16, the front and back of the magnetic metal core plate 15 are coated with a first electrical insulating film 20 and a second electrical insulating film 40, then the surface is flattened by a stamping process stamping the two electrical insulating films 20 and 40. During this time, at the detent torque generating holes 14a to 14c, which are far wider than the through holes $h_1$ to $h_3$, even if voids enter between the two electrical insulating films 20 and 40, the stamping process enables the voids to be ironed out to the outside through the radial direction notches 18a to 18c. For this reason, residual voids in the front-to-back superposed films $W_1$ to $W_3$ can be suppressed, dense, integral front-to-back superposed films $W_1$ to $W_3$ can be formed, and cracking at the time of dropping impact of mobile phones etc. can be suppressed.

While the invention has been described with reference to specific embodiments chosen for purpose of illustration, it should be apparent that numerous modifications could be made thereto by those skilled in the art without departing from the basic concept and scope of the invention.

The invention claimed is:

1. A flat vibration motor provided with a stator plate having a through hole in which one end of a shaft is fit, a cover with an open part covered by the stator plate and having a shaft mounting hole in which the other end of the shaft is fit, and a rotor plate having an axial direction field type rotor magnet and eccentric weight supported to be able to rotate through a slide bearing through which the shaft passes,
wherein the stator plate has a magnetic metal core plate having a plurality of detent torque generating spaces around the through hole, printed interconnect patterns arranged on a first electrical insulating film formed on a front surface of this magnetic metal core plate and interconnecting mounted electronic devices with each other, and electrode patterns arranged on a second electrical insulating film formed on a back surface of the magnetic metal core plate and connecting with interconnect patterns through through holes, the insides of the detent torque generating spaces being covered by front-to-back superposed films of extensions of the first electrical insulating film and second electrical insulating film.

2. The flat vibration motor as set forth in claim 1, wherein said detent torque generating spaces are holes, and the magnetic metal core plate is provided with notches connecting the outer periphery to the holes.

3. The flat vibration motor as set forth in claim 1, wherein the vicinity of the peripheral edge of the through hole at the stator plate is an exposed part of the magnetic metal core plate in the range where no second electrical insulating film is formed.

4. The flat vibration motor as set forth in claim 1, wherein said electrode patterns run across said second electrical insulating film of said front-to-back superposed films.

5. The flat vibration motor as set forth in claim 4, wherein said interconnect patterns include first and second interconnect patterns, the electrode patterns include an inside circular ring shaped electrode pattern connected with the first interconnect pattern through a first through hole and formed concentrically with the through hole and an outside circular ring shaped electrode pattern connected with the second interconnect pattern through a second through hole and formed concentrically with the inside circular ring shaped electrode pattern.

6. The flat vibration motor as set forth in claim 5, wherein said interconnect patterns include a third interconnect pattern, while the electrode patterns include a center circular ring shaped electrode pattern connected with the third interconnect pattern through a third through hole and formed concentrically about said through hole.

7. The flat vibration motor as set forth in claim 6, wherein said third through hole is provided at a position in the interval between the center circular ring shaped electrode pattern and the inside circular ring shaped electrode pattern.

8. The flat vibration motor as set forth in claim 5, wherein the circular ring shape of the inside circular ring shaped electrode pattern has a width broader than the width of the circular ring shape of the outside circular ring shaped electrode pattern.

* * * * *